US012771363B2

(12) United States Patent
Sachs et al.

(10) Patent No.: US 12,771,363 B2
(45) Date of Patent: Oct. 20, 2026

(54) ACCUMULATORS FOR REDUCING FREQUENCY OF SAMPLES AND RELATED APPARATUSES, SYSTEMS, METHODS

(71) Applicant: Microchip Technology Incorporated, Chandler, AZ (US)

(72) Inventors: Jason M. Sachs, Chandler, AZ (US); Bryan Kris, Meridian, ID (US)

(73) Assignee: Microchip Technology Incorporated, Chandler, AZ (US)

( * ) Notice: Subject to any disclaimer, the term of this patent is extended or adjusted under 35 U.S.C. 154(b) by 994 days.

(21) Appl. No.: 17/650,630

(22) Filed: Feb. 10, 2022

(65) Prior Publication Data

US 2022/0253091 A1 Aug. 11, 2022

Related U.S. Application Data

(60) Provisional application No. 63/148,031, filed on Feb. 10, 2021.

(51) Int. Cl.
*H03M 1/06* (2006.01)
*H03H 17/06* (2006.01)
*H03M 1/12* (2006.01)

(52) U.S. Cl.
CPC ...... *H03M 1/0626* (2013.01); *H03H 17/0664* (2013.01); *H03M 1/12* (2013.01)

(58) Field of Classification Search
CPC ... H03M 1/0626; H03M 1/12; H03H 17/0664
See application file for complete search history.

(56) References Cited

U.S. PATENT DOCUMENTS 4,193,118 A 3/1980 Nash et al.
10,491,234 B1 * 11/2019 Bhardwaj ............. H03M 1/361

FOREIGN PATENT DOCUMENTS

CN 112106299 A 12/2020

OTHER PUBLICATIONS

Oljaca et al., "Combining the ADS1202 with an FPGA Digital Filter for Current Measurement in Motor Control Applications", pp. 1-16 (Year: 2003).*

Turner, Clay S., "Slope Filtering: An FIR Approach to Linear Regression", dsp TIPS&TRICKS, doi: 10.1109/MSP.2008.929816, pp. 159-163 (Year: 2008).*

Emerson et al., "MPC5500: A Decimation Solution with Zero CPU Loading", Freescale Semiconductor, Document No. AN3396 , Rev.1 <URL: https://www.nxp.com/docs/en/application-note/AN3396.pdf> (Year: 2011).*

Microchip Technology Inc., "PIC32CM MC00 Family", pp. 11-82 (Year: 2020).*

(Continued)

*Primary Examiner* — Andrew Caldwell
(74) *Attorney, Agent, or Firm* — TraskBritt

(57) ABSTRACT

Accumulators for reducing frequency of samples and related apparatuses, systems, and methods are disclosed. An apparatus includes a first accumulator and a second accumulator. The first accumulator provides a first total. The first total corresponds to a sum of a current sample value of an input signal and a previous value of the first total. The second accumulator provides a second total. The second total corresponds to a sum of the first total and a previous value of the second total.

17 Claims, 9 Drawing Sheets

(56) References Cited

OTHER PUBLICATIONS

"standalone." Merriam-Webster.com. Merriam-Webster, 2016. Web. Oct. 30, 2016. Retrieved online: https://web.archive.org/web/20161030221251/http://www.merriam-webster.com/dictionary/standalone (Year: 2016).*
How to Read Analog Input in a PICMicrocontroller in C (Year: 2018).*
HP Journal Apr. 1968 (Year: 1968).*
ST Microelectronics AN4629 (Year: 2015).*
Microchip AN2749 (Year: 2018).*
Microchip TB3194 (Year: 2018).*
International Search Report from International Application No. PCT/US2022/070618, mailed Apr. 29, 2022, 4 pages.
International Written Opinion from International Application No. PCT/US2022/070618, mailed Apr. 29, 2022, 9 pages.
Royer et al., "Area-Efficient Linear Regression Architecture for Real-Time Signal Processing on FPGAs" 26th Conference on Design of Circuits and Integrated Systems, (Nov. 2011) 6 pages.
Saramaki et al., "A modified comb filter structure for decimation", Proceedings of 1997 IEEE International Symposium on Circuits and Systems, Jun. 9-12, 1997, Hong Kong, vol. 4, (Jun. 9, 1997) pp. 2353-2356.
Turner, "Slope filtering: An FIR approach to linear regression [DSP Tips & Tricks]", IEEE Signal Processing Magazine, vol. 25, No. 6, (Nov. 2008) pp. 159-163.
First Office Action and Search Report of Chinese Patent Application No. 202280014116.3, mailed Mar. 23, 2026, 23 pages with English translation.

* cited by examiner

ACCUMULATORS FOR REDUCING FREQUENCY OF SAMPLES AND RELATED APPARATUSES, SYSTEMS, METHODS

CROSS-REFERENCE TO RELATED APPLICATION

This application claims the benefit under 35 U.S.C. § 119(e) of U.S. Provisional Patent Application No. 63/148,031, filed Feb. 10, 2021, and titled "DUAL ACCUMULATORS FOR DOWNSAMPLING AND RELATED ELECTRONIC DEVICES, SAMPLING SYSTEMS, AND METHODS," the disclosure of which is hereby incorporated herein in its entirety by this reference.

TECHNICAL FIELD

This disclosure relates generally to enhanced accumulators for fast analog-to-digital converters (ADCs), and more specifically to accumulators for reducing frequency of samples.

BACKGROUND

In some electrical devices (e.g., microcontrollers), ADCs may be used for signal processing. In some such electronic devices the ADCs may have sampling rates that exceed the capability of the electrical devices to utilize all the digitized samples. As a result, it may be difficult to take advantage of the high sample rates of ADCs (e.g., substantially 40 mega samples per second (MSPS), or above) without using a large amount of processing power/bandwidth of a processing circuit (e.g., a processing core of the processing circuit) to process the volume of samples from an ADC.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1A:
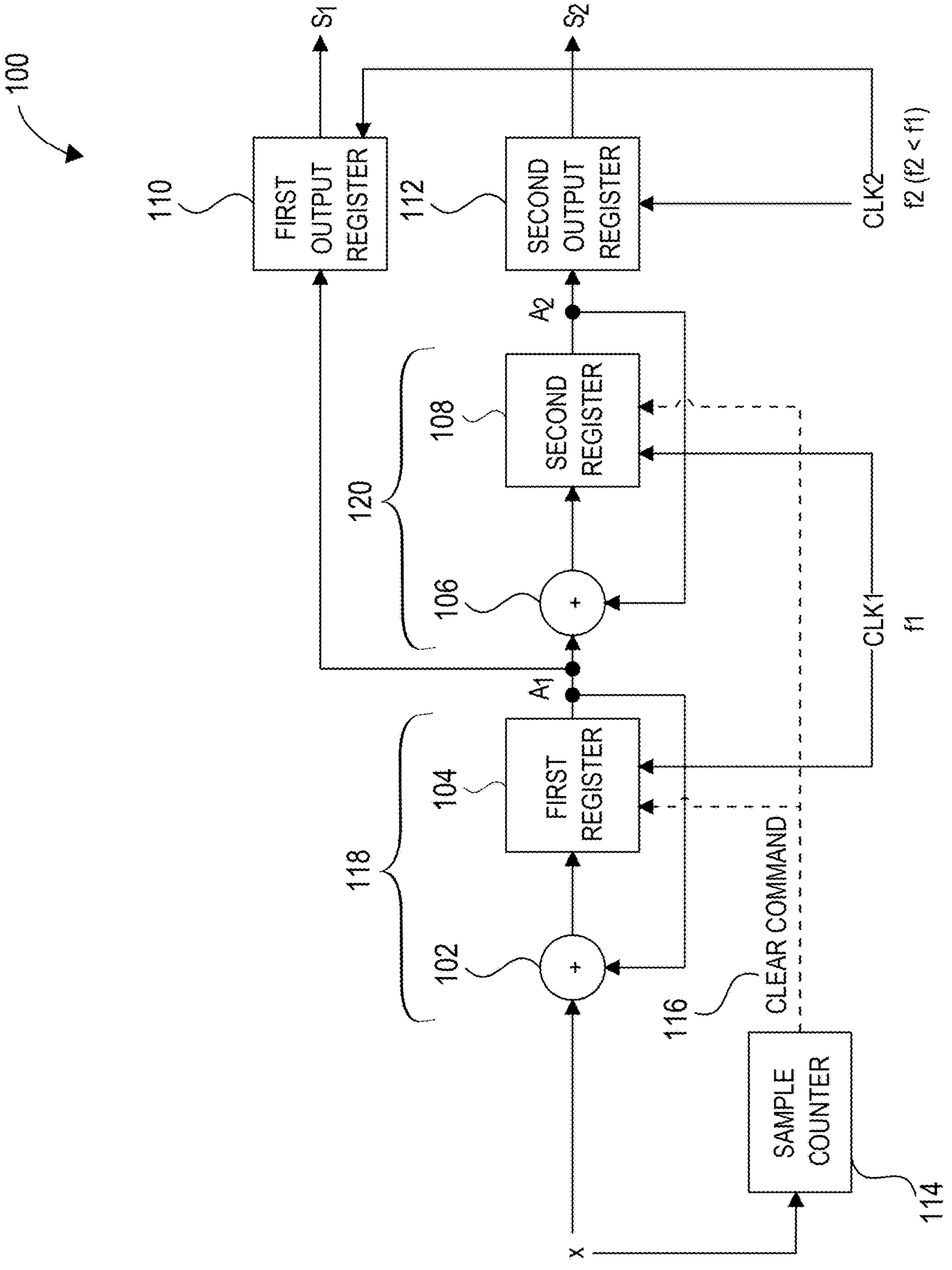
FIG. 1A is a circuit schematic illustration of a dual accumulator, according to some examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is programmed to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as “first,” “second,” and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term “substantially” in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Some electrical devices (e.g., microcontrollers) may be pushed to their processing limits or be insufficient to process samples from ADCs with high sample rates (e.g., 40 MSPS or above). One way to downsample a large number of samples so as to reduce the number of samples processed by these electrical devices is to take averages of groups of samples. For example, using simple (“boxcar”) averaging, for every number N of samples from the ADC, the samples may be summed, and the sum may be divided by the number N, reducing the number of samples to be processed by the electrical device by a factor of N. By way of non-limiting example, where N is 10, only one tenth of a total number of the samples from the ADC may be processed. Also by way of non-limiting example, where N is 100, only one-hundredth of a total number of the samples from the ADC may be processed.

Although such averaging to downsample samples from a high sample rate ADC may provide average values of the samples, such averaging may not provide estimates of the rate of change (e.g., the slope) of an electrical signal represented by the samples from the ADC. By way of non-limiting example, estimates of the slope of the samples from the ADC may be useful for analyzing electrical signals (e.g., current, voltage potential, without limitation) of an electric motor.

Some examples disclosed herein may include hardware peripherals for downsampling samples (e.g., from high sample rate ADCs), wherein the hardware peripherals are independent from a processing core of a processing circuit. These hardware peripherals may be implemented on the same processing circuit chip as the processing core or as a separate standalone device. Some examples disclosed herein may include built-in digital signal processing for high sample rate ADCs. Dual accumulators may be used to support two non-limiting examples of downsampling options: (1) a cascaded integrator-comb (CIC) filter option and (2) a linear least-squares estimation (LLSE) of offset and slope option. Some examples disclosed herein enable use of a full ADC sampling rate with slower software processes than would be required absent the downsampling.

Some examples disclosed herein may include dual cascaded accumulators and double-buffering for ADC downsampling, which facilitate computation of CIC and LLSE of slope/offset, by the performance of critical calculations at the ADC input sampling rate. This may allow software to complete calculations for CIC or slope/offset LLSE at an output rate (e.g., a desired output rate) that is slower than the sampling rate, and that achieves higher resolution than taking single samples at that output rate.

In some examples, an ADC may convert samples at 40 MSPS whether or not the samples are actually used. The ADC may include 1-20 channels (e.g., register sets) for specifying and storing sampled data. By way of non-limiting example, user software is executed by an electrical device (e.g., by a processing core of a device processing circuit) may process samples at 10 kilohertz (kHz) and may set up an ADC trigger at 1280 kHz. As a result, 128× oversampling is used in this non-limiting example, which corresponds to one output sample provided by the dual accumulator combining 128 raw ADC samples.

Non-limiting examples disclosed herein may provide one or more of: useful downsampling features in silicon, improved utilization of high-speed ADCs, higher resolution than decimation (e.g., subsampling at a desired rate), slope estimation, maintenance of low hardware complexity, reduced manufacturing and operating costs, allowing for-low-low-speed processing with high complexity computations left to firmware. In some examples, an ADC and dual accumulator may be implemented on-chip in the processing circuit, but as a peripheral to the processing core and separate from the processing core. In some examples, an ADC and a dual accumulator may be implemented as a standalone ADC and register device separate from the processing circuit.

FIG. 1A is a circuit schematic illustration of a dual accumulator 100, according to some examples. The dual accumulator 100 may, by way of non-limiting example, be used for CIC and LLSE. The dual accumulator 100 includes a first accumulator 118, a second accumulator 120, a first output register 110, and a second output register 112. The first accumulator 118 includes a first summer 102 and a first register 104. The second accumulator 120 includes a second summer 106 and a second register 108. An output of the first accumulator 118 (an output of the first register 104) is electrically connected to an input of the first output register 110, to an input of the second accumulator 120 (to a first input of the second summer 106), and to a second input of first summer 102. The first register 104 and the second register 108 are clocked by a first clock signal CLK1 at a first frequency f1 (e.g., a sample frequency of samples x). An output of the second accumulator 120 (an output of the second register 108) is electrically connected to an input of the second output register 112 and to a second input of the second summer 106. The first output register 110 and the second output register 112 may be clocked by a second clock signal CLK2 at a second frequency f2 that is slower than the first frequency.

Figure 1B:
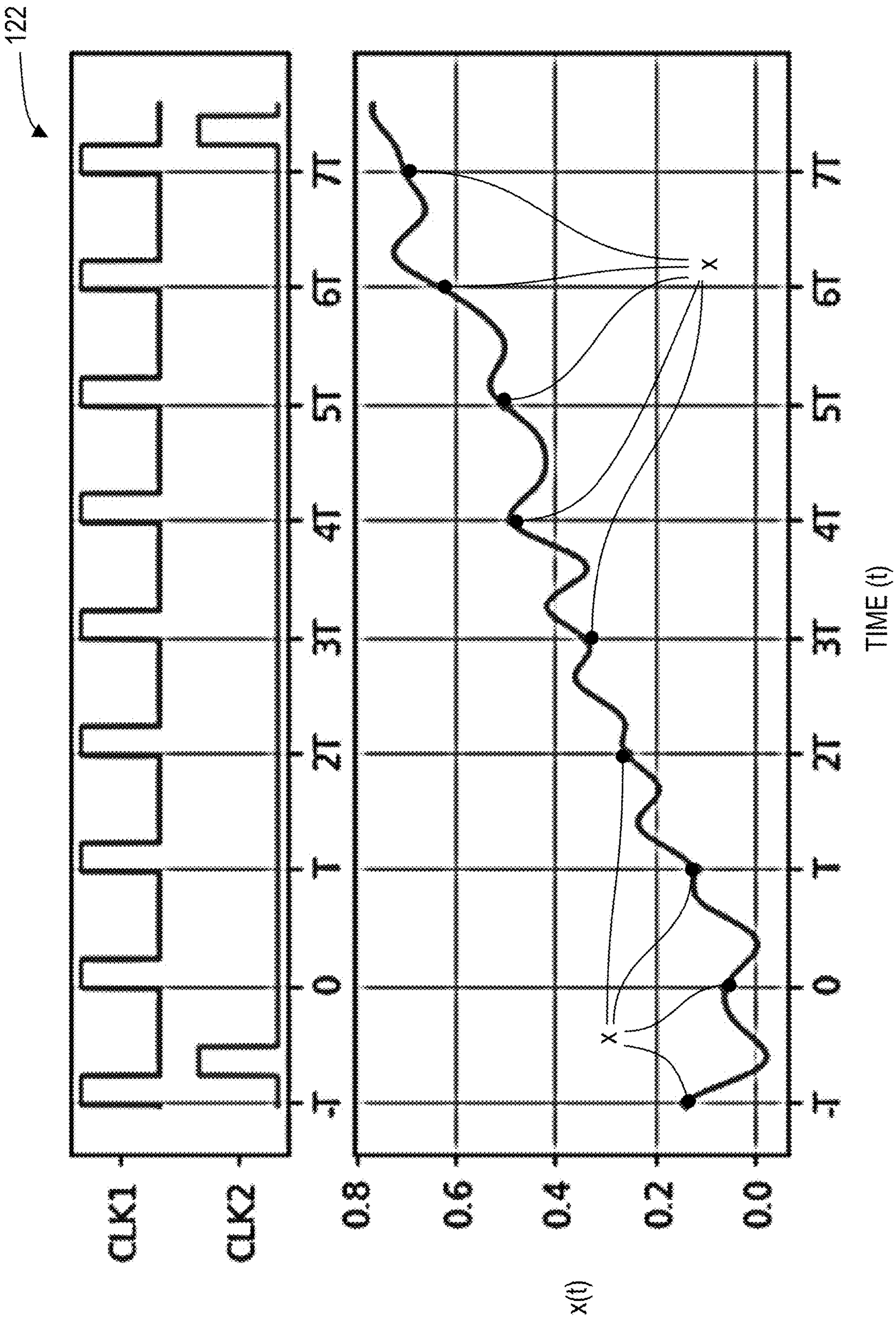
FIG. 1B is a signal timing diagram illustrating signals related to the dual accumulator of FIG. 1A, according to some examples.

An ADC (a high sample rate ADC, by way of non-limiting example) provides the samples x of an input signal (x(t) of FIG. 1B) to the dual accumulator 100, particularly to a first input of the first summer 102. The samples x may be a series of samples acquired from the input signal (an analog signal) by the ADC. The first summer 102 sums a current sample value of the input x with a previous output (a previous value of a first total $A_1$) of the first accumulator 118 to generate a sum of the previous value of the first total $A_1$ and the current sample value x. The first summer 102 provides the sum to an input of the first register 104. The first register 104 provides the first total $A_1$ (e.g., the first accumulator 118 provides the first total $A_1$), which may be substantially the sum of the current sample value x of the input signal and the previous value of the first total $A_1$. The first accumulator 118 provides the first total $A_1$ to an input of the first output register 110, which latches, at an end of an interval of time corresponding to a number N of samples x of the input signal, responsive to an edge of the second clock signal CLK2, the first total $A_1$ as a first latched total $S_1$. The first accumulator 118 also provides the first total $A_1$ to a second input of the first summer 102, and to a first input of the second summer 106. The edge of the clock signal CLK2, occurs at the end of the interval of time, and thus second frequency f2 defines the rate at which the first output register 110 and the second output register 112 latch the respective first total $A_1$ and the second total $A_2$. While a single predetermined edge may be utilized, in another example, each of the rising and falling edges are utilized.

The second summer 106 sums the first total $A_1$ with a previous value of a second total $A_2$ provided by the second register 108 at a second input of second summer 106, and provides the sum of the first total $A_1$ and the previous value of the second total $A_2$ to an input of the second register 108. The second register 108 provides the second total $A_2$, which is substantially the sum of the first total $A_1$ and the previous value of the second total $A_2$ to the second input of the second summer 106 and to an input of the second output register 112. The second output register 112 latches, at the end of the interval of time, corresponding to the number N of samples x of the input signal, responsive to an edge of the second clock signal CLK2, the second total $A_2$, as a second latched total $S_2$. The first latched total $S_1$ and the second latched total $S_2$ may be provided to a processing circuit, at a down-sampled rate f2 relative to a sample rate f1 of the samples x, for further processing.

An optional clear may be performed at a beginning of an interval of time. The first output register 110 and the second output register 112 may latch the first total $A_1$ and the second total $A_2$, respectively, to provide the first latched total $S_1$ and the second latched total $S_2$, respectively, at an end of the interval of time. By way of non-limiting example, a sample counter 114 may count a number N of the samples x and provide a clear command 116 to the first register 104 and the second register 108 when the number N is reached. The first total $A_1$ and the second total $A_2$ may reset to zero responsive to the clear command 116, with the first total $A_1$ and the second total $A_2$, prior to being reset to zero, latched as the first latched total $S_1$ and the second latched total $S_2$.

FIG. 1B is a signal timing diagram illustrating signals 122 related to the dual accumulator 100 of FIG. 1, according to some examples. The signals 122 include the first clock signal CLK1 used to clock the first register 104 and the second register 108 (FIG. 1A), the second clock signal CLK2 used to clock the first output register 110 and the second output register 112 (FIG. 1A), and an input signal x(t) used to produce the samples x. The samples x are values of the input signal x(t) taken at intervals of a period T corresponding to the first frequency f1 of FIG. 1. For example, FIG. 1B illustrates that samples x of the input signal x(t) are taken, i.e., accumulated at first accumulator 118 by first register 104 and at second accumulator 120 by second register 108, at rising edges of the first clock signal CLK1 at times −T, 0, T, 2T, 3T, 4T, 5T, 6T, and 7T. FIG. 1B also illustrates that the second clock signal CLK2 pulses about every eight pulses of the first clock signal CLK1. It should be noted that the ratio of a number of pulses of the first clock signal CLK1 to a number of pulses of the second clock signal CLK2 may be different (e.g., 1:100, 1:128, any other ratio, without limitation).

Figure 2:
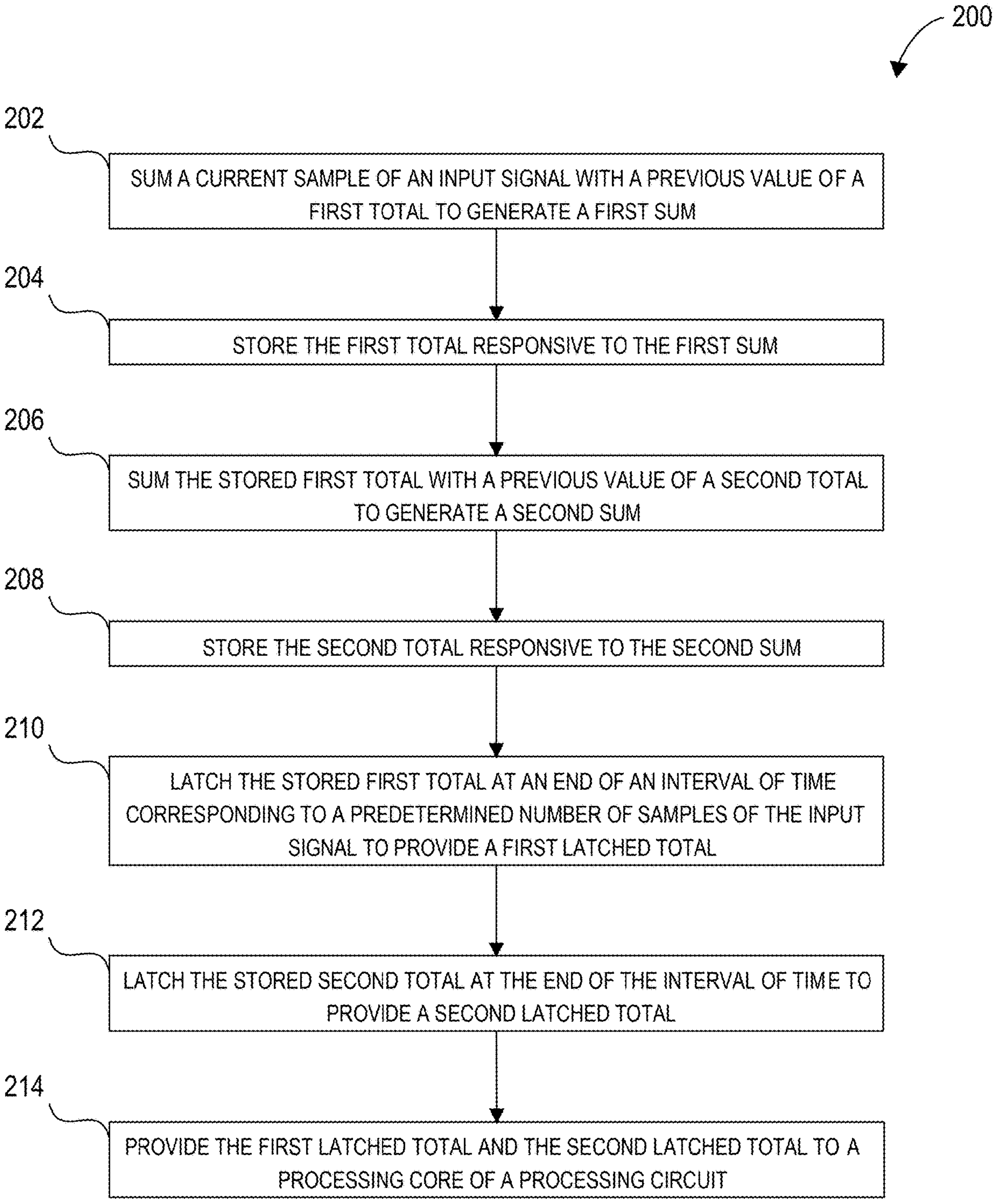
FIG. 2 is a flowchart illustrating a method of operating a dual accumulator, according to some examples.

FIG. 2 is a flowchart illustrating a method 200 of operating a dual accumulator, according to some examples. At operation 202 the method 200 includes summing a current sample of an input signal with a previous value of a first total to generate a first sum. At operation 204 the method 200 includes storing the first total responsive to the first sum.

At operation 206 the method 200 includes summing the stored first total with a previous value of a second total to generate a second sum. At operation 208 the method 200 includes storing the second total responsive to the second sum.

At operation 210 the method 200 includes latching the stored first total at an end of an interval of time corresponding to a predetermined number of samples of the input signal to provide a first latched total. At operation 212 the method 200 includes latching the stored second total at the end of the time window to provide a second latched total. At operation 214 the method 200 includes providing the first latched total and the second latched total to a processing core of a processing circuit.

Figure 3:
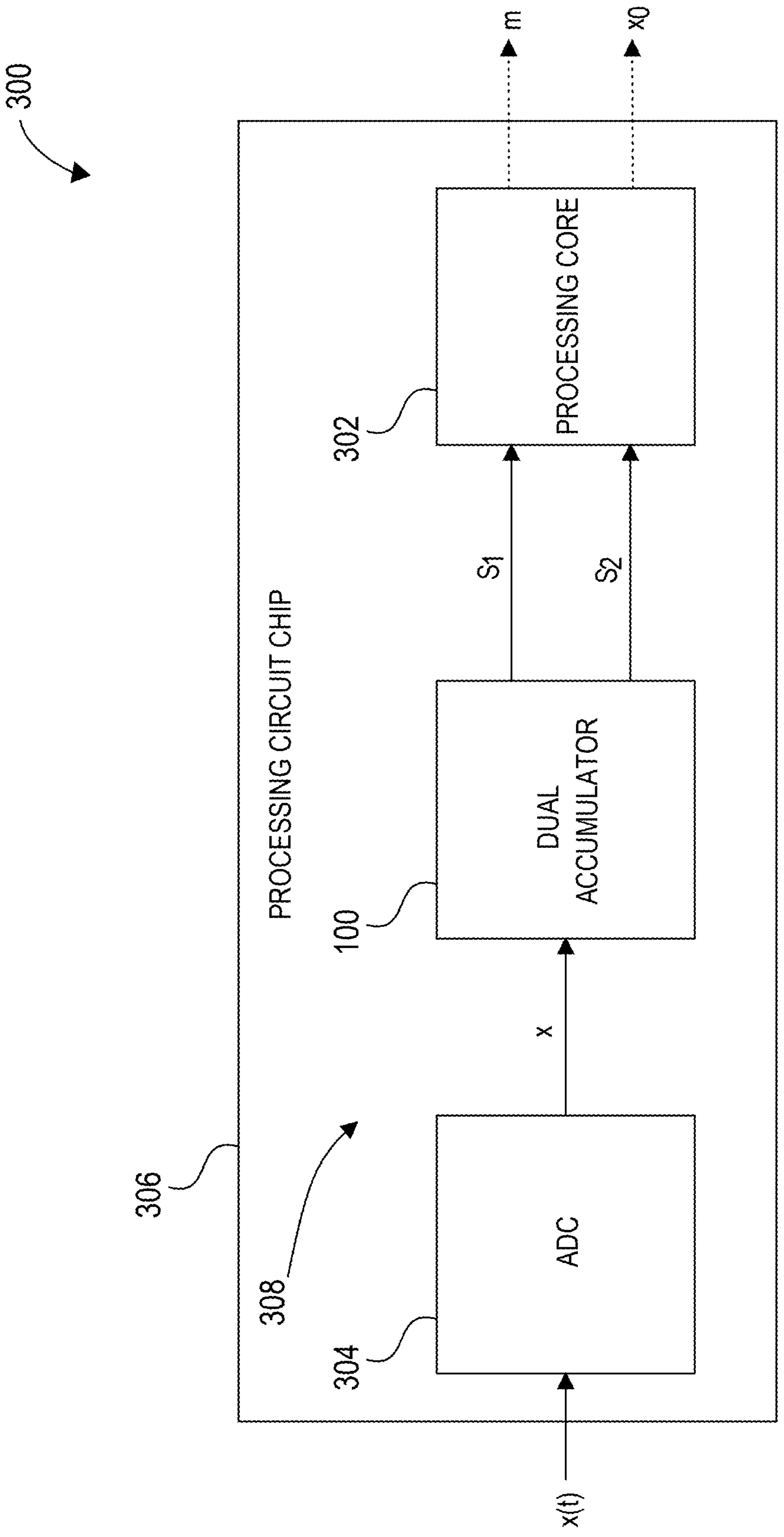
FIG. 3 is a block diagram of a sampling system including the dual accumulator of FIG. 1A, according to some examples.

FIG. 3 is a block diagram of sampling system 300 including the dual accumulator 100 of FIG. 1, according to some examples. The sampling system 300 also includes a processing circuit chip 306 including an analog-to-digital converter (ADC) 304, the dual accumulator 100, and a processing core 302 (sometimes referred to as "CPU 302"). As a specific, non-limiting example, the processing circuit chip may be a microcontroller, a central processing unit (CPU), a programmable logic device, or other processing circuit. Also by way of non-limiting example, the first accumulator 118 (FIG. 1) and the second accumulator 120 (FIG. 1) of the dual accumulator 100 and the ADC 304 may be implemented as a single hardware peripheral 308 to the processing core 302.

The ADC 304 receives an input signal x(t), and samples the input signal x(t) to produce the samples x. By way of non-limiting example, the input signal x(t) may be an electrical signal (e.g., a current, a voltage potential, without limitation) of an electrical motor. The ADC 304 may have a high sample rate (e.g., 40 MSPS) as compared to a desired sample rate of a digital input to the processing core 302. For example, the processing core 302 may in some cases lack sufficient processing power to process the number of samples x provided by the ADC 304. As another example, even if the processing core 302 has sufficient processing power to process the number of samples x provided by the ADC 304 it may be desired to process fewer samples (e.g., to reduce power consumption of the processing core 302, to reduce interruptions on other tasks performed by the processing core 302). The ADC 304 provides the samples x of the input signal x(t) to the dual accumulator 100.

The dual accumulator 100 receives the samples x from the ADC 304 and generates the first latched total $S_1$ and the second latched total $S_2$, as discussed with reference to FIG. 1. The dual accumulator 100 provides the first latched total $S_1$ and the second latched total $S_2$ to the processing core 302 for processing.

The processing core 302 receives the first latched total $S_1$ and the second latched total $S_2$ from the dual accumulator 100. The processing core 302 estimates an arithmetic mean $x_0$ and a slope m of the samples of the input signal x over a time window to form an LLSE fit to the equation $\hat{x}=x_0+mu$, where m is a slope, $$u = \frac{(t - t_0)}{t_{samp}},$$

t is time, $t_0$ is a center time of an interval of time, and $t_{samp}$ is a period of time between samples x (e.g., the period T of FIG. 1B). The signal u (which is a function of time t) may represent a normalized time signal that is normalized to the input sample period $t_{samp}$ relative to the center to of the interval of time, and x may be an estimate of the input signal x(t) at time t. The arithmetic mean $x_0$ is determined as the first latched total S1 divided by the number of samples represented by first latched total S1. In other words, the arithmetic mean $x_0$ is determined as the first latched total S1 divided by N, where N is the number of pulses of the first clock signal CLK1 per pulse of the second clock signal CLK2.

A formula for the slope coefficient of a simple linear regression with independent variable u and dependent variable x is $$m = \frac{\sum u_k x_k - \frac{1}{N}\sum u_k \sum x_k}{\sum u_k^2 - \frac{1}{N}\left(\sum u_k\right)^2},$$

where N is the total number of samples x of the input signal x(t) over the time window.

The latched totals S1 and S2 may be shown to be equivalent to the following expressions:

$$S_1 = \sum x_k$$

$$S_2 = (N-1)S_1 + \sum_{k=0}^{N-1} k x_k$$

The mean $x_0$ may be given by:

$$x_0 = \frac{1}{N} S_1.$$

Starting from the above expression for the slope m, solving for the slope m yields the following:

$$m = \frac{12}{N^3 - N}\left(S_2 - 3\frac{N-1}{2}S_1\right).$$

Accordingly, the processing core 302 determines estimated values of an arithmetic mean $x_0$ and a slope m of the samples x responsive to the first latched total $S_1$ and the second latched total $S_2$. More specifically, the arithmetic mean $x_0$ may be determined responsive to the first latched total $S_1$, and the slope m may be determined responsive to the first latched total $S_1$ and the second latched total $S_2$.

The arithmetic mean $x_0$ may be used as a downsampled sample of the input signal x(t) over the time window. By way of non-limiting example, if the processing core 302 is to process downsampled samples at a rate that is 1/100 that of the sample rate of the samples x, the time window may be set so that N=100. Assuming that the input signal x(t) substantially approximates a straight line over the time window, the CPU 302 may extrapolate an estimate of a value of the input signal x (t) at any point of time, t, proximate to a center time, to, of the time window (e.g., any time within the time window, as well as times outside but near the boundaries of the time window) responsive to the arithmetic mean $x_0$ and the slope m based on:

$$x(t) = x_0 + \frac{m(t - t_0)}{t_{samp}}.$$

Accordingly, although the processing core 302 may accept a single sample (the arithmetic mean $x_0$) for the entire time window, the processing core 302 may estimate values for the input signal x(t) at any point in time during the time window based on the arithmetic mean $x_0$ and the slope m.

As previously discussed, the sampling system 300 may be useful for applications that require a slope of the input signal x(t). The sampling system 300 is also useful for correcting sample timeskew where it is desired to estimate a value of the input signal x(t) at a time $(t_0+\delta t)$ different from the center time to, as will be discussed with reference to FIG. 6, according to:

$$x(t_0+\delta t)=x_0+m(t_0+\delta t-t_0)/t_{samp}=x_0+m\delta t/t_{samp}.$$

Figure 4:
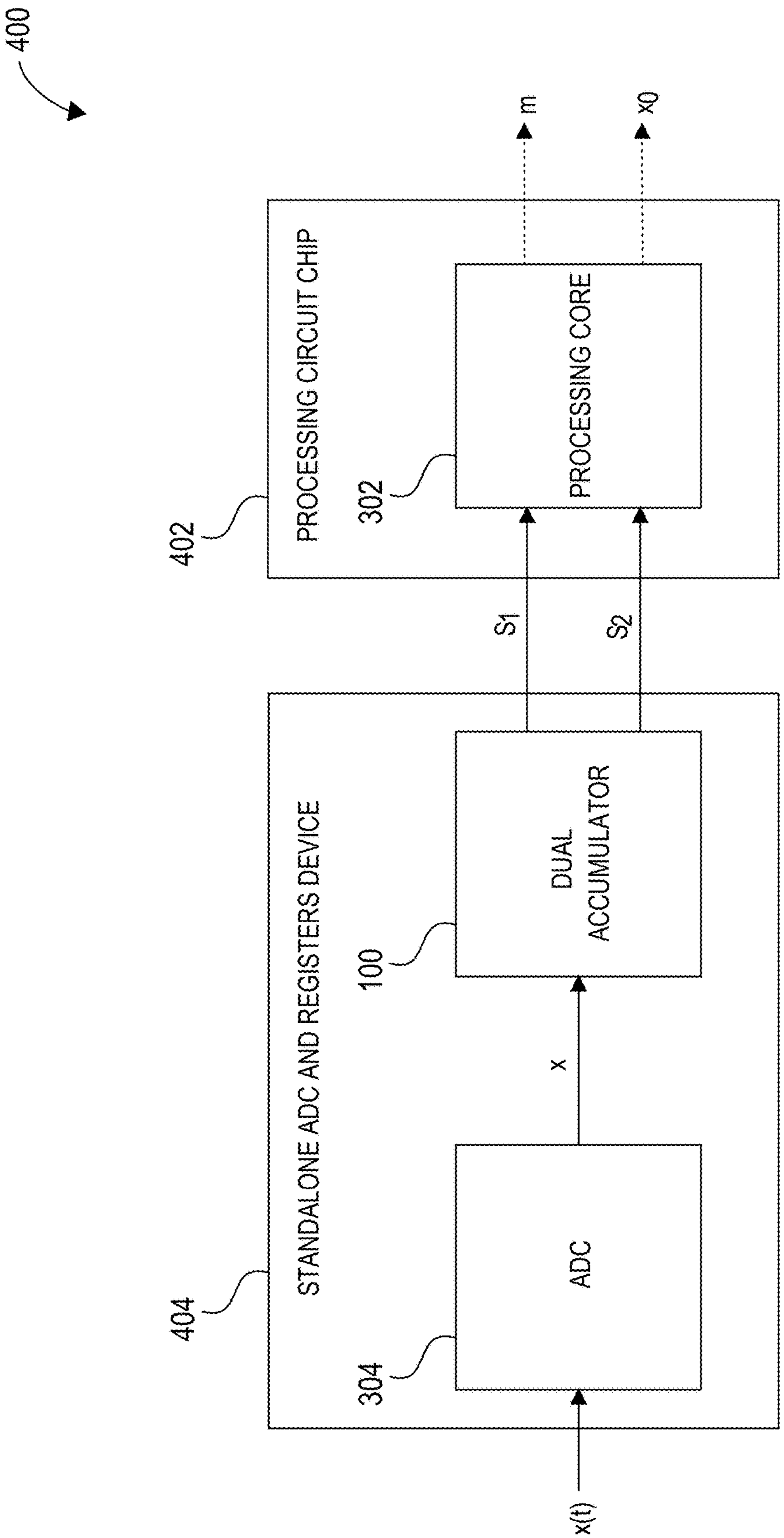
FIG. 4 is a block diagram of another sampling system including the dual accumulator of FIG. 1A, according to some examples.

FIG. 4 is a block diagram of another sampling system 400 including the dual accumulator 100 of FIG. 1, according to some examples. The sampling system 400 is similar to the sampling system 300 of FIG. 3. For example, the sampling system 400 includes the ADC 304, the dual accumulator 100, and the processing core 302 discussed with reference to FIG. 3. The sampling system 400, however, includes a processing circuit chip 402 including the processing core 302, and a standalone ADC and registers device 404 that is separate from the processing circuit chip 402. The standalone ADC and registers device 404 includes the ADC 304 and the dual accumulator 100.

Figure 5:
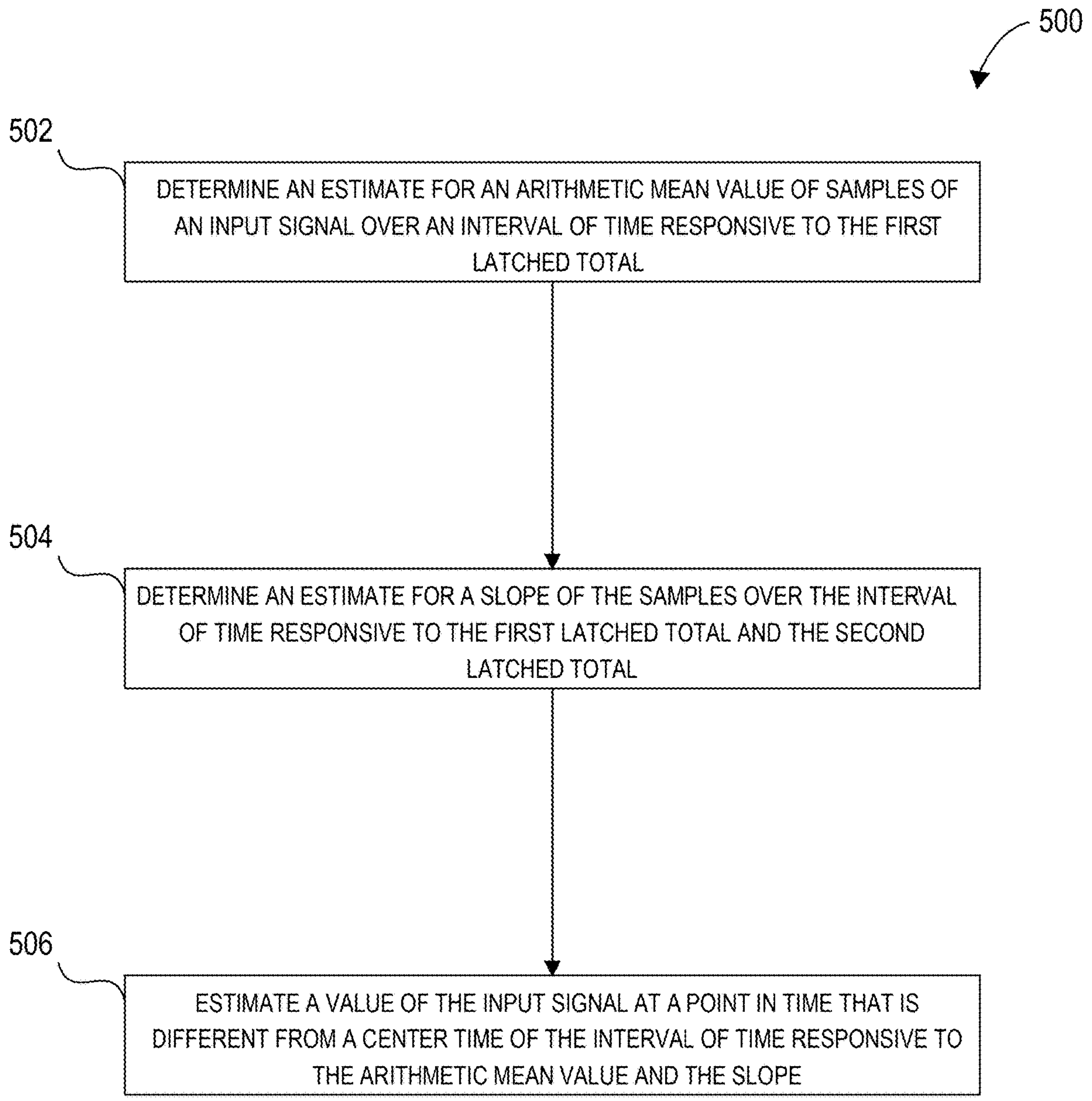
FIG. 5 is a flowchart illustrating a method of processing a first latched total and a second latched total from a dual accumulator, according to some examples.

FIG. 5 is a flowchart illustrating a method 500 of processing a first latched total and a second latched total from a dual accumulator 100, according to some examples. At operation 502 the method 500 includes determining an estimate for an arithmetic mean value of samples of an input signal over an interval of time responsive to the first latched total. At operation 504 the method 500 includes determining an estimate for a slope of the samples over the interval of time responsive to the first latched total and the second latched total. At operation 506 the method 500 includes estimating a value of the input signal at a point in time that is different from a center time of the interval of time responsive to the mean value and the slope.

Figure 6:
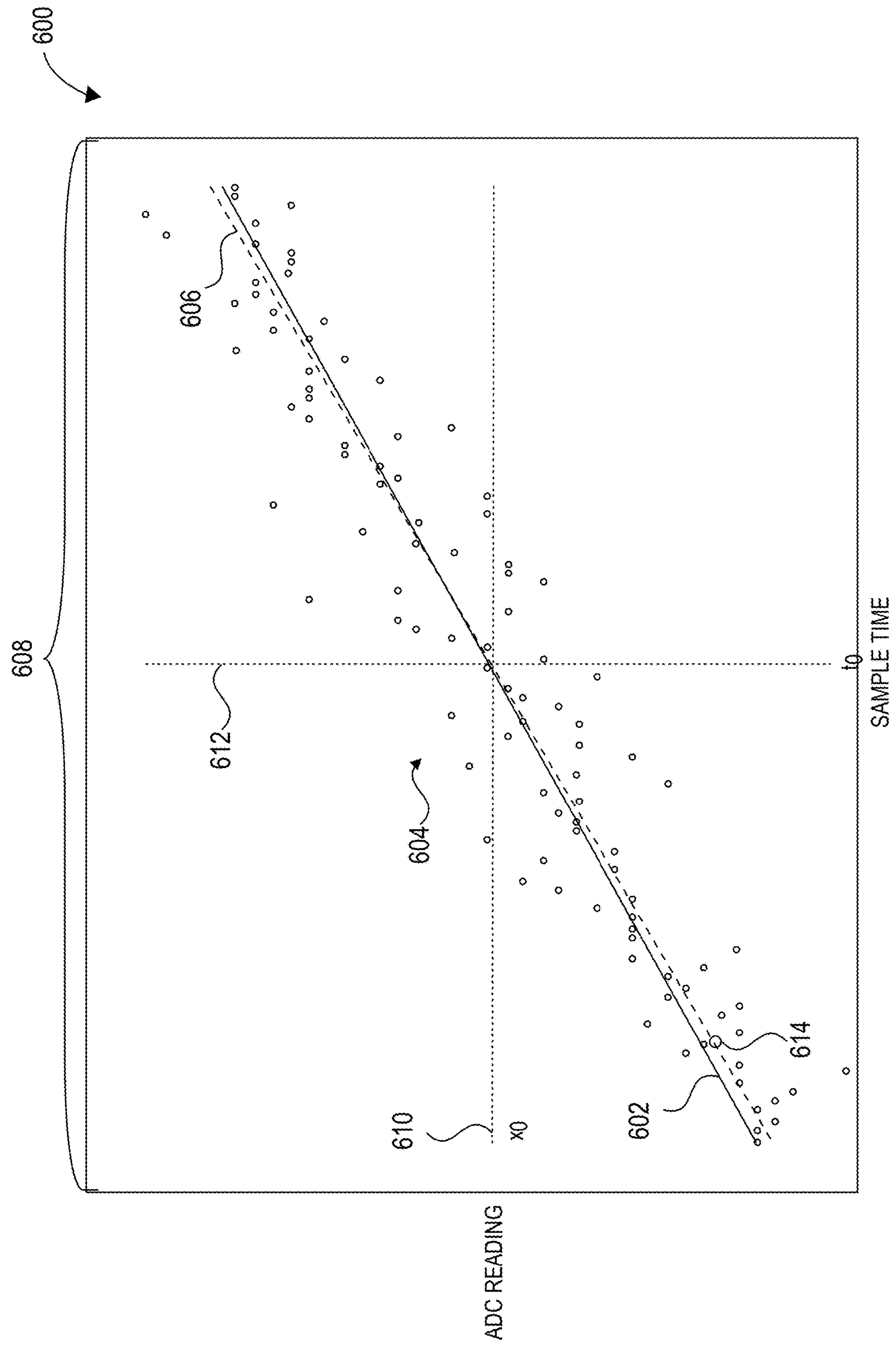
FIG. 6 is a plot illustrating example signals of the sampling system of FIG. 3.

FIG. 6 is a plot illustrating example signals 600, including samples 604 ($x$) of ADC readings (vertical axis) of the sampling system 300 of FIG. 3 and the sampling system 400 of FIG. 4 over an interval of time 608 of a sample time (horizontal axis). The example signals 600 include a noiseless input signal x(t) representation 602 (solid line), samples 604 (circles), and an estimated fit 606 (broken line) of the samples 604. FIG. 6 illustrates the arithmetic mean value 610 ($x_0$) and a center time 612 ($t_0$) of the interval of time 608. The estimated fit 606 may be derived by the CPU 302 of FIG. 3 or FIG. 4. The slope m and arithmetic mean value 610 ($x_0$) define the estimated fit 606. As illustrated in FIG. 6, the estimated fit 606 closely approximates the noiseless input signal x(t) representation 602 and, therefore, serves as an accurate estimate for the noiseless input signal x(t) representation 602 over the interval of time 608.

Since the estimated fit 606 closely approximates the noiseless input signal x(t) representation 602, the arithmetic mean value 610 and the center time 612 may be used to determine an estimated value 614 of the noiseless input signal 602 along the estimated fit 606 at a point in time other than the center time 612. As a result, the arithmetic mean value 610 and the center time 612 may be used to correct for timeskew.

Figure 7:
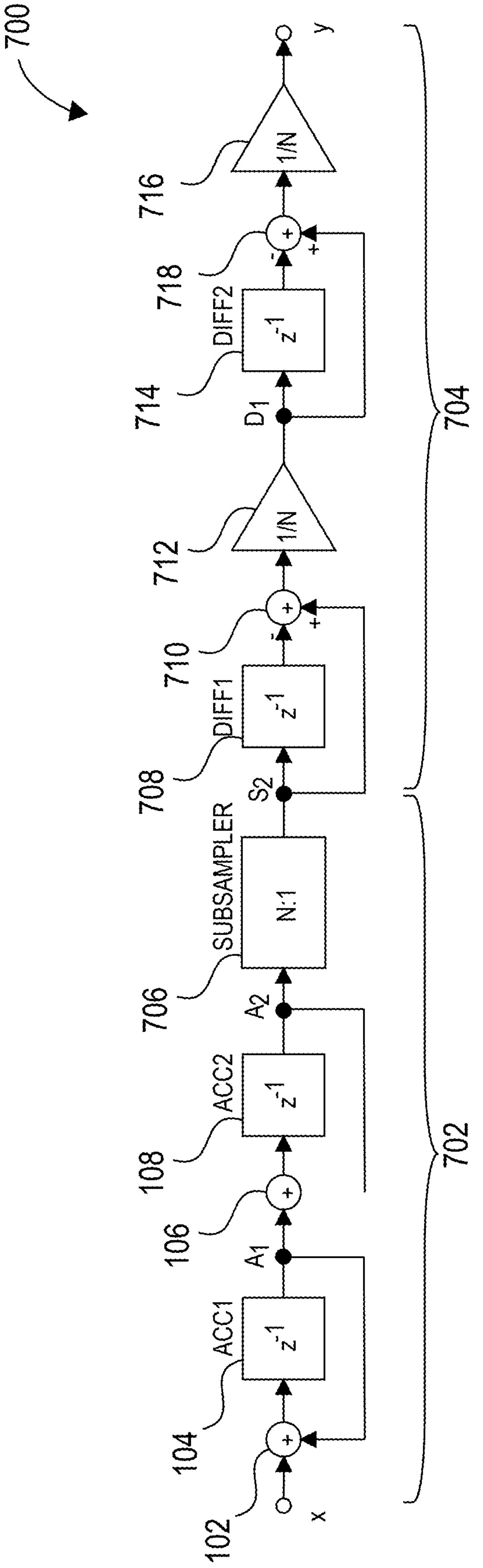
FIG. 7 is a circuit schematic illustration of a cascaded integrator-comb (CIC) filter that may be implemented by the sampling system of FIG. 3, according to some examples.

FIG. 7 is a circuit schematic illustration of a cascaded integrator-comb filter (CIC filter 700) that may be implemented at least partially by the sampling system 300 of FIG. 3, according to some examples. The CIC filter 700 may be implemented between an input of samples x to the CIC filter 700 and an output signal y provided by the CIC filter 700. The CIC filter 700 includes a portion 702 that includes the dual accumulator 100 of FIG. 1 and computational logic 704. The portion 702 includes the first summer 102, the first register 104 ("ACC1"), the second summer 106, and the second register 108 ("ACC2") discussed above with reference to FIG. 1. The portion 702 also includes a subsampler 706 (e.g., an N:1 subsampler), which may include the first output register 110 and the second output register 112 discussed above with reference to FIG. 1 (e.g., only the second output register 112 may be used). In some examples, the portion 702 may be implemented as a hardware peripheral 308 to the processing core 302 (FIG. 3), and may be implemented on chip (e.g., the processing circuit chip 306 of FIG. 3) with the processing core 302. In some examples, the portion 702 may be implemented as a standalone ADC and registers device 404 (FIG. 4) off of a processing circuit chip 402 (FIG. 4).

In some examples, the computational logic 704 may be implemented in software (e.g., software, firmware, or combinations thereof) executed by the processing core 302 (FIG. 3, FIG. 4). The computational logic 704 includes a first unit delay 708 ("DIFF1"), a third summer 710, a first divider 712 ("1/N") to output a value Di, a second unit delay 714 ("DIFF2"), a fourth summer 718, and a second divider 716 ("1/N").

In some examples, the operations performed by the CIC filter 700 (and by the sampling system 300 of FIG. 3 or the sampling system 400 of FIG. 4) may be continuously repeating. In some examples, the number N of samples in the time window may be constant. In the case of the CIC filter 700, no accumulator clear may be used (e.g., wraparound may be used).

Figure 8:
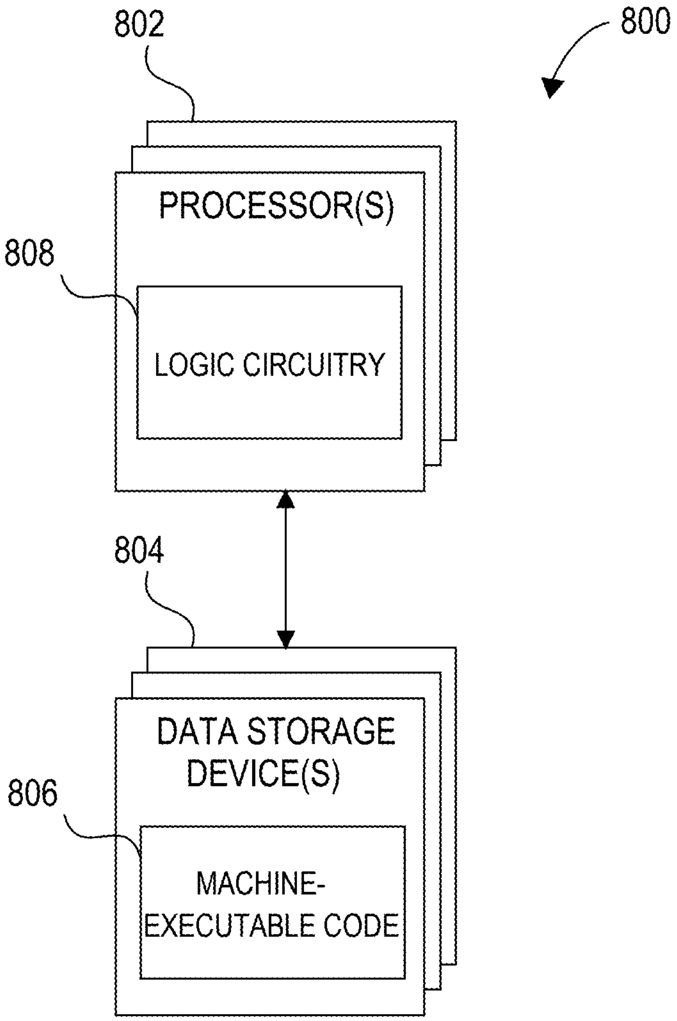
FIG. 8 is a block diagram of circuitry that, in some examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 8 illustrates non-limiting examples of implementations of functional elements disclosed herein. In some examples, some or all portions of the functional elements disclosed herein may be performed by hardware specially programmed for carrying out the functional elements.

FIG. 8 is a block diagram of circuitry 800 that, in some examples, may be used to implement various functions, operations, acts, processes, and/or methods disclosed herein. The circuitry 800 includes one or more processors 802 (sometimes referred to herein as "processors 802") operably coupled to one or more data storage devices (sometimes referred to herein as "storage 804"). The storage 804 includes machine-executable code 806 stored thereon and the processors 802 include logic circuitry 808. The machine-executable code 806 includes information describing functional elements that may be implemented by (e.g., performed by) the logic circuitry 808. The logic circuitry 808 is adapted to implement (e.g., perform) the functional elements described by the machine-executable code 806. The circuitry 800, when executing the functional elements described by the machine-executable code 806, should be considered as special purpose hardware for carrying out functional elements disclosed herein. In some examples, the processors 802 may perform the functional elements described by the machine-executable code 806 sequentially, concurrently (e.g., on one or more different hardware platforms), or in one or more parallel process streams.

When implemented by logic circuitry 808 of the processors 802, the machine-executable code 806 adapts the processors 802 to perform operations of examples disclosed herein. For example, the machine-executable code 806 may adapt the processors 802 to perform at least a portion or a totality of the method 500 of FIG. 5. As another example, the machine-executable code 806 may adapt the processors 802 to perform at least a portion or a totality of the operations discussed for the CPU 302 of FIG. 3 and FIG. 4, the portion of computational logic 704 of FIG. 7, or combinations thereof. As a specific, non-limiting example, the machine-executable code 806 may adapt the processors 802 to determine an arithmetic mean value $x_0$ (FIG. 3 and FIG. 4) and a slope m (FIG. 3 and FIG. 4) of samples x of an input signal x(t) (FIG. 1, FIG. 3, and FIG. 4) over an interval of time responsive to a first latched total $S_1$ (FIG. 1, FIG. 3) and a second latched total $S_2$ (FIG. 1, FIG. 3, and FIG. 4). As another specific, non-limiting example, the machine-executable code 806 may adapt the processors 802 to estimate a value of an input signal (e.g., x(t) of FIG. 3 and FIG. 4) responsive to the arithmetic mean value $x_0$ (FIG. 3 and FIG. 4) and the slope m (FIG. 3 and FIG. 4).

The processors 802 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is programmed to execute functional elements corresponding to the machine-executable code 806 (e.g., software code, firmware code, hardware descriptions) related to examples of the present disclosure. It is noted that a general-purpose processor (may also be referred to herein as a host processor or simply a host) may be a microprocessor, but in the alternative, the processors 802 may include any conventional processor, controller, microcontroller, or state machine. The processors 802 may also be implemented as a combination of computing devices, such as a combination of a DSP and a microprocessor, a plurality of microprocessors, one or more microprocessors in conjunction with a DSP core, or any other such configuration.

In some examples, the storage 804 includes volatile data storage (e.g., random-access memory (RAM)), non-volatile data storage (e.g., Flash memory, a hard disc drive, a solid-state drive, erasable programmable read-only memory (EPROM), without limitation). In some examples, the processors 802 and the storage 804 may be implemented into a single device (e.g., a semiconductor device product, a system on chip (SOC), without limitation). In some examples, the processors 802 and the storage 804 may be implemented into separate devices.

In some examples, the machine-executable code 806 may include computer-readable instructions (e.g., software code, firmware code). By way of non-limiting example, the computer-readable instructions may be stored by the storage 804, accessed directly by the processors 802, and executed by the processors 802 using at least the logic circuitry 808. Also by way of non-limiting example, the computer-readable instructions may be stored on the storage 804, transferred to a memory device (not shown) for execution, and executed by the processors 802 using at least the logic circuitry 808. Accordingly, in some examples, the logic circuitry 808 includes electrically configurable logic circuitry 808.

In some examples, the machine-executable code 806 may describe hardware (e.g., circuitry) to be implemented in the logic circuitry 808 to perform the functional elements. This hardware may be described at any of a variety of levels of abstraction, from low-level transistor layouts to high-level description languages. At a high level of abstraction, a hardware description language (HDL) such as an IEEE Standard hardware description language (HDL) may be used. By way of non-limiting examples, Verilog™, System Verilog™ or very large-scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 808 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples, the machine-executable code 806 may include an HDL, an RTL, a GL description, a mask level description, other hardware description, or any combination thereof.

In examples where the machine-executable code 806 includes a hardware description (at any level of abstraction), a system (not shown, but including the storage 804) may implement the hardware description described by the machine-executable code 806. By way of non-limiting example, the processors 802 may include a programmable logic device (e.g., an FPGA or a PLC) and the logic circuitry 808 may be electrically controlled to implement circuitry corresponding to the hardware description into the logic circuitry 808. Also by way of non-limiting example, the logic circuitry 808 may include hard-wired logic manufactured by a manufacturing system (not shown, but including the storage 804) according to the hardware description of the machine-executable code 806.

Regardless of whether the machine-executable code 806 includes computer-readable instructions or a hardware description, the logic circuitry 808 is adapted to perform the functional elements described by the machine-executable code 806 when implementing the functional elements of the machine-executable code 806. It is noted that although a hardware description may not directly describe functional elements, a hardware description indirectly describes functional elements that the hardware elements described by the hardware description are capable of performing.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1

An apparatus, comprising: a first accumulator to provide a first total, the first accumulator including a first summer and a first register, the first total corresponding to a sum of a current sample value of an input signal and a previous value of the first total; a second accumulator to provide a second total, the second accumulator including a second summer and a second register, the first register and the second register clocked at a first frequency, the second total corresponding to a sum of the first total and a previous value of the second total; a first output register to latch a first latched total responsive to the first total; and a second output register to latch a second latched total responsive to the second total, the first output register and the second output register clocked at a second frequency that is slower than the first frequency.

Example 2

The apparatus of Example 1, comprising an analog to digital converter (ADC) to sample the input signal and provide the samples to the first accumulator.

Example 3

The apparatus of Example 2, wherein the ADC provides the samples at the first frequency.

Example 4

The apparatus according to any one of Examples 2 and 3, wherein the ADC and a dual accumulator including the first accumulator, the second accumulator, the first output register, and the second output register are implemented as a standalone ADC and registers device separate from a processing circuit.

Example 5

The apparatus according to any one of Examples 2 and 3, wherein the ADC and a dual accumulator including the first accumulator, the second accumulator, the first output register, and the second output register are implemented on a processing circuit chip as an on-chip peripheral to a processing core of the processing circuit.

Example 6

The apparatus of Example 5, comprising a sample counter to count the predetermined number of samples of the input signal.

Example 7

A system, comprising: a first accumulator to provide a first total and a second accumulator to provide a second total responsive to samples of an input signal, the first total corresponding to a sum of the samples over an interval of time, the second total corresponding to a sum of the first total and a previous value of the second total; and a processing core to generate estimates for an arithmetic mean value and a slope of the samples over the interval of time responsive to a first latched total and a second latched total, the first latched total responsive to the first total and the second latched total responsive to the second total.

Example 8

The system of Example 7, comprising an analog to digital converter (ADC) to sample the input signal and provide the samples to the first accumulator.

Example 9

The system of Example 8, wherein a sample rate of the ADC is faster than a clocking frequency of output registers that latch the first latched total and the second latched total.

Example 10

The system of Example 9, wherein the first accumulator, the second accumulator, and the ADC are implemented as a single hardware peripheral to the processing core.

Example 11

The system according to any one of Examples 7-10, comprising: a first output register to store the first total and provide a first latched total responsive to the first total; and a second output register to store the second total and provide a second latched total responsive to the second total.

Example 12

The system of Example 11, wherein the first output register provides the first latched total and the second output register provides the second latched total at an end of the interval of time responsive to a clock signal having a frequency that is less than a sampling frequency of the samples.

Example 13

The system according to any one of Examples 7-12, wherein the processing core generates the estimate of the slope of the samples over the interval of time using a linear least-squares estimation of the slope at least based on the first latched total and the second latched total.

Example 14

The system according to any one of Examples 7-12, wherein the processing core generates the estimate of the slope of the samples over the interval of time responsive to the first total, the second total, and a number of the samples in the interval of time.

Example 15

The system according to any one of Examples 7-12, wherein the CPU generates the estimate of the arithmetic mean value of the samples over the interval of time by dividing the first total by a number of the samples of the input signal in the interval of time.

Example 16

A method, comprising: summing a current sample of an input signal with a previous value of a first total to generate a first sum; storing the first total responsive to the first sum; summing the stored first total with a previous value of a second total to generate a second sum; storing the second total responsive to the second sum; latching the stored first total at an end of an interval of time corresponding to a predetermined number of samples of the input signal to provide a first latched total; and latching the stored second total at the end of the interval of time to provide a second latched total.

Example 17

The method of Example 16, comprising providing the first latched total and the second latched total to a processing core of a processing circuit.

Example 18

A method of processing a first latched total and a second latched total from a dual accumulator, the method comprising: determining an estimate for an arithmetic mean value of samples of an input signal over an interval of time responsive to the first latched total; and determining an estimate for a slope of the samples over the interval of time responsive to the first latched total and the second latched total.

Example 19

The method of Example 18, comprising estimating a value of the input signal at a point in time that is different from a center time of the interval of time responsive to the determined estimate for the arithmetic mean value of the samples and the determined estimate for the slope of the samples.

Example 20

An electronic device, comprising: a first accumulator configured to provide an updated first total, the updated first total corresponding to a sum of a current sample value of an input signal and a previous value of the updated first total; and a second accumulator configured to provide an updated second total, the updated second total corresponding to a sum of the updated first total and a previous value of the updated second total.

Example 21

The electronic device of Example 20, further comprising a first register configured to latch a first latched total responsive to the first updated total.

Example 22

The electronic device of Example 21, further comprising a second register configured to latch a second latched total responsive to the second updated total.

Example 23

The electronic device of Example 22, wherein the first register and the second register are configured to latch the first latched signal and the second latched signal, respectively, at a rate that is slower than a sample rate of the input signal.

Example 24

The electronic device of Example 22, wherein the first register and the second register are configured to latch the first latched signal and the second latched signal, respectively, at an end of a predetermined time window corresponding to a predetermined number of samples of the input signal.

Example 25

A sampling system, comprising: a dual accumulator including a first accumulator and a second accumulator, the dual accumulator configured to provide a first latched total and a second latched total responsive to an input signal including samples of an analog signal, the first latched total corresponding to a sum of the samples over a predetermined time window; and a central processing unit (CPU) configured to generate estimates for a mean value and a slope of the samples over the predetermined time window responsive to the first latched total and the second latched total.

Example 26

The sampling system of Example 25, further comprising an analog to digital converter (ADC) configured to sample the analog signal and provide the input signal to the dual accumulator.

Example 27

The sampling system of Example 26, wherein a sample rate of the ADC is faster than a processing speed of the CPU.

Example 28

The sampling system according to any one of Examples 25-27, wherein the dual accumulator is implemented as a hardware peripheral to the CPU.

Example 29

The sampling system according to any one of Examples 25-28, wherein the dual accumulator includes: a first accumulator configured to generate a first updated total responsive to a sum of a sample of the input signal and a previous value of the first updated total; and a second accumulator configured to generate a second updated total responsive to a sum of the first updated total and a previous value of the second updated total.

Example 30

The sampling system of Example 29, wherein the dual accumulator further includes: a first register configured to latch the first latched total responsive to the first updated total at an end of the predetermined time window; and a second register configured to latch the second latched total responsive to the second updated total at an end of the predetermined time window.

Example 31

The sampling system according to any one of Examples 25-30, wherein the CPU is configured to generate the estimate of the slope of the samples over the predetermined time window using a linear least-squares estimation of the slope.

Example 32

The sampling system according to any one of Example 25-30, wherein the CPU is configured to generate the estimate of the slope of the samples over the predetermined time window according to:

$$m = \frac{12}{N^3 - N}\left(S_2 - 3\frac{N-1}{2}S_1\right),$$

where m is the estimate of the slope, N is a number of the samples of the analog signal in the predetermined time window, $S_1$ is the first latched total, and $S_2$ is the second latched total.

Example 33

The sampling system according to any one of Examples 25-30, wherein the CPU is configured to generate the estimate of the mean value of the samples over the predetermined time window by dividing the first latched total by a number of the samples of the analog signal in the predetermined time window.

Example 34

A method of operating a dual accumulator, the method comprising: summing a current sample of an analog signal with a previous value of a first total to generate a first sum; generating a first updated total responsive to the first sum; summing the updated total with a previous value of a second total to generate a second sum; generating a second updated total responsive to the second sum; latching the first updated total at an end of a time window corresponding to a predetermined number of samples of the analog signal to provide a first latched total; and latching the second updated total at the end of the time window to provide a second latched total.

Example 35

The method of Example 34, further comprising providing the first latched total and the second latched total to a central processing unit.

Example 36

A method of processing a first latched total and a second latched total from a dual accumulator, the method comprising: determining an estimate for a mean value of samples of an analog signal over a predetermined time window responsive to the first latched total; and determining an estimate for a slope of the samples over the predetermined time window responsive to the first latched total and the second latched total.

Example 37

The method of Example 36, further comprising estimating a value of the analog signal at a point in time that is different from a center time of the predetermined time window responsive to the mean value and the slope.

CONCLUSION

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:

a processing circuit; and a dual accumulator including:

a first accumulator, the first accumulator including a first summer and a first register, the first summer including an output coupled to an input of the first register, the first register clocked at a first frequency, the first accumulator to provide a first total at an output of the first register responsive to respective first clocks at the first frequency, the first total corresponding to a sum of a current sample value of an input signal and a previous value of the first total provided at the output of the first register;

a second accumulator, the second accumulator including a second summer and a second register, the second summer including an input coupled to the output of the first register and an output coupled to an input of the second register, the second register clocked at the first frequency, the second accumulator to provide a second total at an output of the second register responsive to respective first clocks at the first frequency, the second total corresponding to a sum of the first total provided at the output of the first register and a previous value of the second total provided at the output of the second register;

a first output register, the first output register clocked at a second frequency that is slower than the first frequency, the first output register to latch the first total provided at the output of the first register as a first latched total responsive to respective second clocks at a second frequency; and a second output register, the second output register clocked at the second frequency, the second output register to latch the second total provided at the output of the second register as a second latched total responsive to respective second clocks at the second frequency, wherein the dual accumulator is implemented as one of an on-chip peripheral to a processing core of the processing circuit or a standalone device separate from the processing circuit.

2. The apparatus of claim 1, wherein the apparatus further comprises an analog to digital converter (ADC) to sample the input signal and provide samples to the first accumulator, the first output register includes a first output coupled to a first input of the processing circuit to provide the first latched total to the processing core, and the second output register includes a second output coupled to a second input of the processing circuit to provide the second latched total to the processing core.

3. The apparatus of claim 2, wherein the ADC provides the samples at the first frequency.

4. The apparatus of claim 2, wherein the ADC and the dual accumulator are implemented as the standalone device separate from the processing circuit.

5. The apparatus of claim 2, wherein the ADC and the dual accumulator are implemented on the processing circuit as the on-chip peripheral to the processing core.

6. The apparatus of claim 5, comprising a sample counter to count a predetermined number of samples of the input signal and to cause the first output register and the second output register to reset responsive to the count of the predetermined number of samples.

7. The apparatus of claim 1, wherein:

the processing core of the processing circuit is to generate estimates for an arithmetic mean value and a slope of samples over an interval of time responsive to the first latched total and the second latched total.

8. A system, comprising:

a first accumulator to provide a first total and a second accumulator to provide a second total responsive to samples of an input signal sampled at a sampling frequency, the first total corresponding to a sum of a respective one of the samples and a previous value of the first total, the second total corresponding to a sum of the first total and a previous value of the second total;

a first output register to latch the first total as a first latched total at the end of an interval of time responsive to a clock signal, the clock signal having a frequency that is less than the sampling frequency;

a second output register to latch the second total as a second latched total at the end of the interval of time responsive to the clock signal; and a processing circuit including a processing core, the processing circuit including a first input and a second input, the first input coupled to a first output of the first output register to receive the first latched total at the processing core, the second input coupled to a second output of the second output register to receive the second latched total at the processing core, the processing core to generate estimates for an arithmetic mean value and a slope of the samples over the interval of time responsive to the first latched total and the second latched total.

9. The system of claim 8, comprising an analog to digital converter (ADC) to sample the input signal and provide the samples to the first accumulator.

10. The system of claim 9, wherein the sample frequency of the ADC is faster than the frequency of the clock signal used to latch the first latched total and the second latched total.

11. The system of claim 10, wherein the first accumulator, the second accumulator, and the ADC are implemented as a single hardware peripheral to the processing core.

12. The system of claim 8, wherein the processing core generates the estimates of the slope of the samples over the interval of time using a linear least-squares estimation of the slope at least based on the first latched total and the second latched total.

13. The system of claim 8, wherein the processing core generates the estimates of the slope of the samples over the interval of time responsive to the first total, the second total, and a number of the samples in the interval of time.

14. A method, comprising:

at a dual accumulator, the dual accumulator including a first accumulator and a second accumulator, the first accumulator including a first summer and a first register, the first summer having an output coupled to an input of the first register and an input coupled to an output of the first register, the second accumulator including a second summer and a second register, the second summer having an output coupled to an input of the second register, an input coupled to the output of the first register, and another input coupled to an output of the second register, for respective first clocks of a first clock signal having a first frequency at which an input signal is sampled:

summing, at the first summer, a current sample of the input signal with a previous value of a first total provided at the output of the first register to generate a first sum;

storing, at the first register, the first sum as a current value of the first total;

summing, at the second summer, the current value of the first total with a previous value of a second total provided at the output of the second register to generate a second sum; and storing, at the second register, the second sum as a current value of the second total;

for respective second clocks of a second clock signal having a second frequency that is lower than the first frequency:

latching, at a first output register, the current value of the first total provided at the output of the first register to provide a first latched total at an end of an interval of time corresponding to a predetermined number of samples of the input signal;

latching, at a second output register, the current value of the second total provided at the output of the second register to provide a second latched total at the end of the interval of time; and providing the first latched total and the second latched total to a processing core of a processing circuit, wherein the dual accumulator is implemented as one of an on-chip peripheral to the processing core of the processing circuit or a standalone device separate from the processing circuit.

15. The method of claim 14, comprising:

at the processing core, generating estimates for an arithmetic mean value and a slope of the samples over the interval of time responsive to the first latched total and the second latched total.

16. A method comprising:

at a processing core of a processing circuit, the processing core to interface with a dual accumulator implemented as one of an on-chip peripheral to the processing core of the processing circuit or a standalone device separate from the processing circuit, the dual accumulator including a first accumulator and a second accumulator, the first accumulator including a first output coupled to a first input of the processing circuit, the second accumulator including a second output coupled to a second input of the processing circuit, receiving, at the first and the second inputs of the processing circuit, first and second latched totals from the first and the second outputs of the dual accumulator, the first and the second latched totals comprising first and second totals, respectively, latched from the first and the second accumulators, respectively, at an end of an interval of time responsive to a clock signal, the first and the second accumulators responsive to samples of an input signal sampled at a sampling frequency, the sampling frequency higher than a frequency of the clock signal, the first total corresponding to a sum of a respective one of the samples and a previous value of the first total, the second total corresponding to a sum of the first total and a previous value of the second total;

determining an estimate for an arithmetic mean value of samples of the input signal over the interval of time responsive to the first latched total; and determining an estimate for a slope of the samples over the interval of time responsive to the first latched total and the second latched total.

17. The method of claim 16, comprising:

at the processing core of the processing circuit, estimating a value of the input signal at a point in time that is different from a center time of the interval of time responsive to the determined estimate for the arithmetic mean value of the samples and the determined estimate for the slope of the samples.

* * * * *